US009786788B1

(12) United States Patent
Anderson et al.

(10) Patent No.: US 9,786,788 B1
(45) Date of Patent: Oct. 10, 2017

(54) VERTICAL-TRANSPORT FINFET DEVICE WITH VARIABLE FIN PITCH

(71) Applicant: GLOBALFOUNDRIES INC., Cayman Cayman (KY)

(72) Inventors: Brent Anderson, Essex Junction, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/204,259

(22) Filed: Jul. 7, 2016

(51) Int. Cl.
*H01L 29/66* (2006.01)
*H01L 29/786* (2006.01)
*H01L 29/423* (2006.01)

(52) U.S. Cl.
CPC .. *H01L 29/78642* (2013.01); *H01L 29/42392* (2013.01); *H01L 29/66666* (2013.01); *H01L 29/66742* (2013.01); *H01L 29/78618* (2013.01); *H01L 29/78696* (2013.01)

(58) Field of Classification Search
CPC ........ H01L 29/78642; H01L 29/78696; H01L 29/66742; H01L 29/42392; H01L 29/66666; H01L 29/78618
See application file for complete search history.

(56) References Cited

U.S. PATENT DOCUMENTS

| 9,418,994 | B1* | 8/2016 | Chao ................... H01L 27/0886 |
| 9,455,331 | B1* | 9/2016 | Cai ..................... H01L 29/6656 |
| 9,570,555 | B1* | 2/2017 | Pranatharthiharan H01L 29/0847 |
| 2012/0280331 | A1* | 11/2012 | Ou .................... H01L 21/82343 257/401 |
| 2014/0110817 | A1* | 4/2014 | Bergendahl ......... H01L 21/3086 257/506 |
| 2016/0147926 | A1* | 5/2016 | Chiang ................. H03K 19/02 716/122 |
| 2016/0329402 | A1* | 11/2016 | Cheng ................. H01L 21/3086 |
| 2016/0379987 | A1* | 12/2016 | Liu ................... H01L 27/11524 257/316 |

* cited by examiner

*Primary Examiner* — Victor A Mandala
(74) *Attorney, Agent, or Firm* — Scully Scott Murphy and Presser; Frank Digiglio

(57) ABSTRACT

A semiconductor device includes a plurality of vertical-transport fin field effect transistors that are arranged at a locally-variable fin pitch. Within a first region of the device, a first plurality of fins are arranged at a first pitch (d1), and within a second region of the device, a second plurality of fins are arranged as a second pitch (d2) less than the first pitch. The second plurality of fins share merged source, drain and gate regions, while the source, drain and gate regions for the first plurality of fins are unmerged.

15 Claims, 5 Drawing Sheets

VERTICAL-TRANSPORT FINFET DEVICE WITH VARIABLE FIN PITCH

BACKGROUND

The present application relates generally to semiconductor devices, and more particularly to vertical-transport fin field effect transistors (VT-FinFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 10 nm thick, or less, on the surface of a substrate using selective-etching techniques. A gate structure is then deposited to contact multiple surfaces of each fin to form a multi-gate architecture. However, while the thin channel enables robust control of the device, its shape limits the flow of current when the device is turned on. In this regard, multiple fins are typically arranged in parallel to provide higher drive strength.

Vertical-transport FETs are devices where the source-drain current flows in a direction normal to the substrate surface. In vertical-transport FinFET devices, the fin defines the channel with the source and drain regions located at opposing (i.e., upper and lower) ends of the fin. An advantage of the vertical-transport field effect transistor is that the channel length is not defined by lithography, but by methods such as epitaxy or layer deposition, which enable precise dimensional control. A further advantage is that the maximum gate length is not limited by the transistor density or spacing.

A limitation associated with a vertical-transport FET architecture is a low effective channel width ($W_{eff}$). In contrast to a conventional FinFET where the fin height can be increased to provide additional channel cross section, increasing the fin dimension in a vertical-transport structure either disadvantageously consumes additional real estate or increases the distance, and hence the resistance, between the source and drain. Accordingly, it would be advantageous to provide a robust, vertical-transport FinFET manufacturing process and associated structure that are compatible with existing circuit designs, while enabling high drive strength.

SUMMARY

In accordance with embodiments of the present application, a vertical-transport FinFET device comprises a locally-variable fin pitch, i.e., locally-variable fin periodicity. Specifically, source, drain and channel regions are respectively merged within discrete regions of the device to form a consolidated architecture where the fin pitch is less than that which is achievable in an unmerged (isolated) structure. The tighter fin pitch can meaningfully improve logic circuit density, performance and manufacturability. Moreover, the tighter fin pitch and attendant merged architecture improve both the drive and the capacitance of the associated circuit, which can particularly benefit the operation of various circuits, including inverter circuits.

According to various embodiments, a semiconductor device is formed on a semiconductor substrate. A first plurality of fins are arranged at a first pitch (d1), and a second plurality of fins are arranged at a second pitch (d2) on the semiconductor substrate such that the ratio of the first pitch to the second pitch (d1/d2) is greater than 1.

In further exemplary embodiments, a semiconductor device includes a plurality of fins arranged on a semiconductor substrate at a pitch of 15 to 30 nm. A source region is in shared electrical contact with a plurality of the fins at first respective ends thereof, and a drain region is in shared electrical contact with a plurality of the fins at second respective ends thereof, such that a channel region is defined between the source and drain regions. A gate dielectric layer is disposed on sidewalls of the channel regions, and a gate conductor layer is disposed over and electrically isolated from the channel regions by the gate dielectric layer.

A method of forming a vertical-transport semiconductor device includes forming a plurality of first and second fins on a semiconductor substrate such that the plurality of first fins are arranged at a first pitch (d1) and the plurality of second fins are arranged at a second pitch (d2), where d1>d2. A merged source region is formed in electrical contact with a plurality of the second fins at first respective ends thereof; and a merged drain region is formed in electrical contact with a plurality of the second fins at second respective ends thereof. The plurality of second fins also include a channel region defined between the merged source and drain regions.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
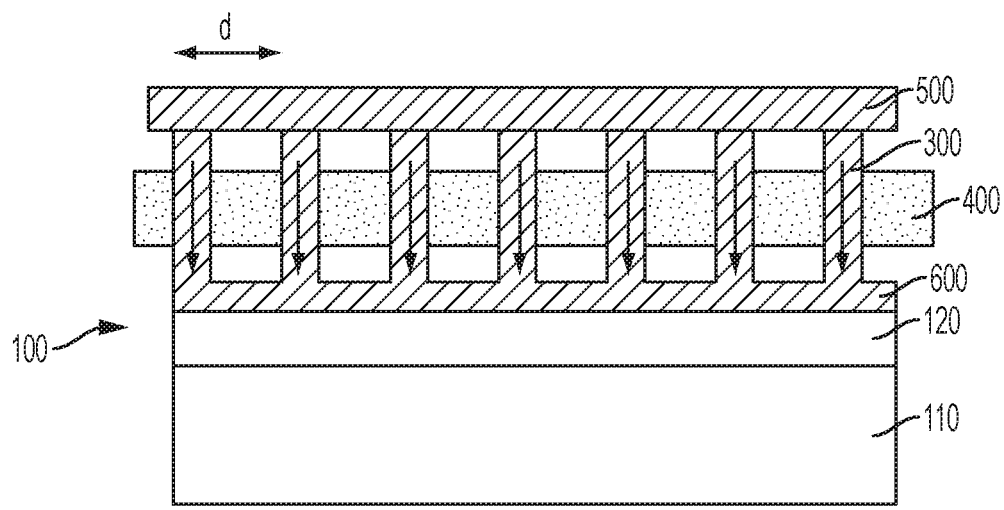
FIG. 1 is a simplified schematic diagram of an example vertical-transport fin field effect transistor having merged source, drain, and gate regions according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Embodiments of the application relate generally to the manufacture of semiconductor devices, and more particularly to the manufacture of vertical-transport fin field effect transistors (V-FinFETs). Exemplary devices include vertical-transport fin field effect transistors having merged source, drain and gate regions. Merger of the source, drain and gate obviates the need to maintain space between adjacent gates, which enables a fin pitch and hence a $W_{eff}$ density not achievable with conventional, isolated devices.

With reference to FIG. 1, a semiconductor device according to various embodiments includes a substrate 100 having a plurality of fins 300 formed thereon. Merged source and drain regions 500, 600 are respectively in contact with fins 300 at opposing ends thereof, while a merged gate stack 400 contacts the sidewalls of the fins 300, defining a channel region between the source and drain regions. In the geometry of FIG. 1, fins 300 are arranged in parallel between merged source region 500 and merged drain region 600.

Figure 2:
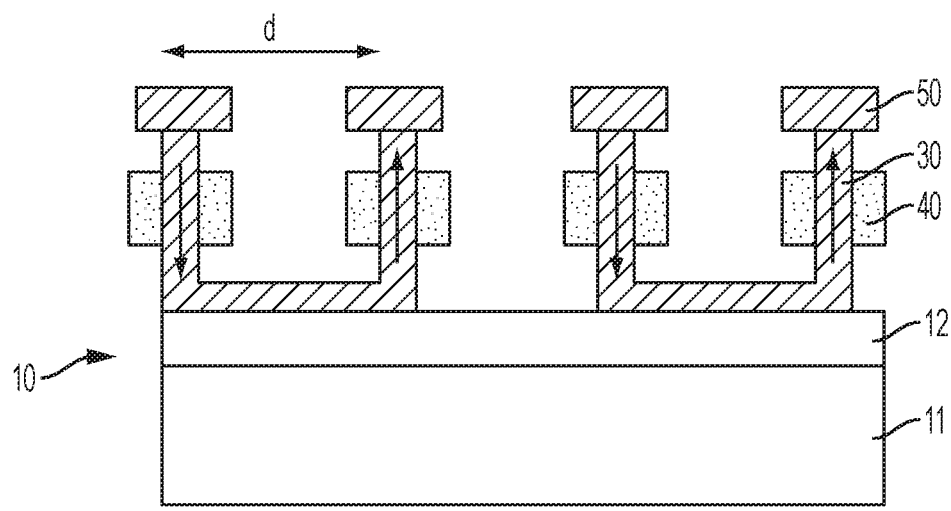
FIG. 2 is a vertical-transport field effect transistor having isolated source/drain regions and gate stacks.

In contrast, a conventional device is illustrated in FIG. 2. The device of FIG. 2 includes a vertical fin structure having plural fins 30 disposed on the isolation layer 12 of a semiconductor substrate 10 that includes supporting substrate 11. Each fin 30 comprises an isolated, independent gate stack 40 and an isolated, independent source/drain region 50. The fins 30 are arranged in series between source/drain regions 50.

It will be appreciated that because the gate stack 400 in the device of FIG. 1 is merged across the plurality of fins 300, the vertical fin pitch (d) can be smaller and the associated effective width ($W_{eff}$) can be significantly greater for the merged architecture than for the unmerged, isolated architecture of FIG. 2. This allows for a significant increase in logic circuit density, which directly benefits device speed.

According to various embodiments, the ratio of the fin pitch (d) for a conventional, unmerged V-FinFET architecture to the fin pitch for the presently-disclosed merged structures is greater than 1, i.e., 1.5, 2, 2.5 or 3, including ranges between any of the foregoing values. The tighter pitch is achievable at least in part by eliminating the need to maintain space between adjacent gates.

Reference will now be made to FIGS. 3-8, which together with the following description, provide an exemplary method for manufacturing the merged device architecture of FIG. 1.

Figure 3:
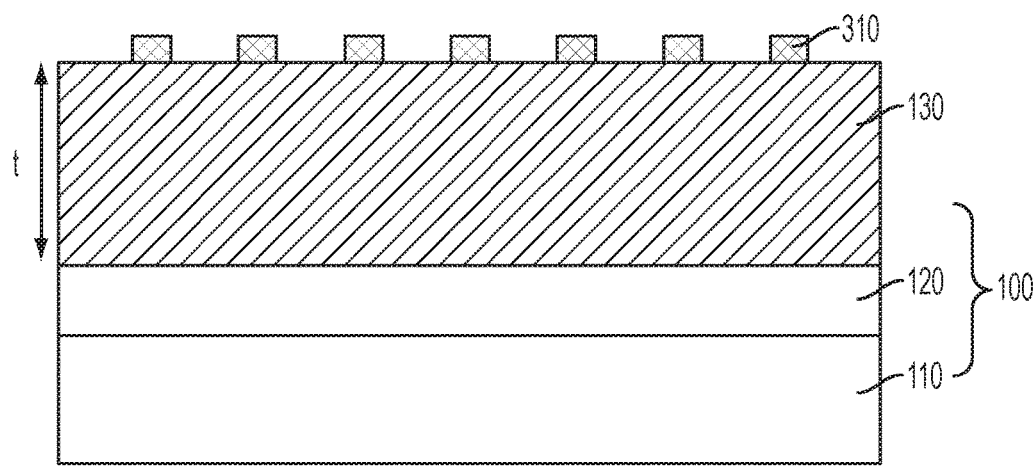
FIG. 3 shows an example semiconductor substrate used to fabricate a vertical-transport field effect transistor in conjunction with various embodiments.

With reference to FIG. 3, a semiconductor substrate 100 may be used to form the transistor architecture. Semiconductor substrate 100 may be a semiconductor material such as silicon or a silicon-containing material, including a bulk substrate. Silicon-containing materials include, but are not limited to, single crystal Si, polycrystalline Si, single-crystal silicon germanium (SiGe), polycrystalline silicon germanium, silicon doped with carbon (Si:C), amorphous Si, as well as combinations and multi-layers thereof. Example silicon substrates include silicon-on-insulator (SOI) substrates, silicon-on-sapphire (SOS) substrates, and the like. As used herein, the term "single crystal" denotes a crystalline solid, in which the crystal lattice of the entire sample is substantially continuous and substantially unbroken to the edges of the sample with substantially no grain boundaries.

The substrate 100 is not limited to silicon-containing materials, as the substrate 100 may comprise other semiconductor materials, including Ge and compound semiconductors such as GaAs, InAs and other like semiconductors. In the illustrated embodiment, substrate 100 is a semiconductor-on-insulator (SOI) substrate and comprises, from bottom to top, a supporting substrate 110, an isolation layer 120, and a semiconductor material layer 130.

Substrate 100 may have dimensions as typically used in the art. Example substrates may include semiconductor wafers. Wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The supporting substrate 110 may comprise (100)-oriented silicon or (111)-oriented silicon, for example.

The isolation layer 120 may comprise the buried oxide (BOX) layer of a semiconductor-on-insulator (SOI) substrate, an oxidized layer of a bulk silicon substrate, or a lightly-doped bulk silicon layer of opposite doping polarity as that of the overlaying sources and drains. The thickness of the isolation layer 120 may range from 30 to 300 nm, e.g., 30, 50, 100, 150, 200, 250 or 300 nm, including ranges between any of the foregoing values. The isolation layer 120 may comprise, for example, silicon dioxide ($SiO_2$). Alternatively, isolation layer 120 may comprise silicon nitride, silicon oxynitride, a low-k material, or any suitable combination of these materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon oxide. Disposed over the isolation layer 120 is a semiconductor material layer 130.

Semiconductor material layer 130 may comprise any of the semiconductor materials listed above in association with substrate 100. Example semiconductor materials that form semiconductor material layer 130, and which may be used for form semiconductor fins 300, include silicon (Si), germanium (Ge), silicon germanium (SiGe), III-V compound semiconductors such as GaAs, GaN, GaP, InAs, InSb, ZnSe, and ZnS, and II-VI compound semiconductors such as CdSe, CdS, CdTe, ZnSe, ZnS and ZnTe.

Figure 4:
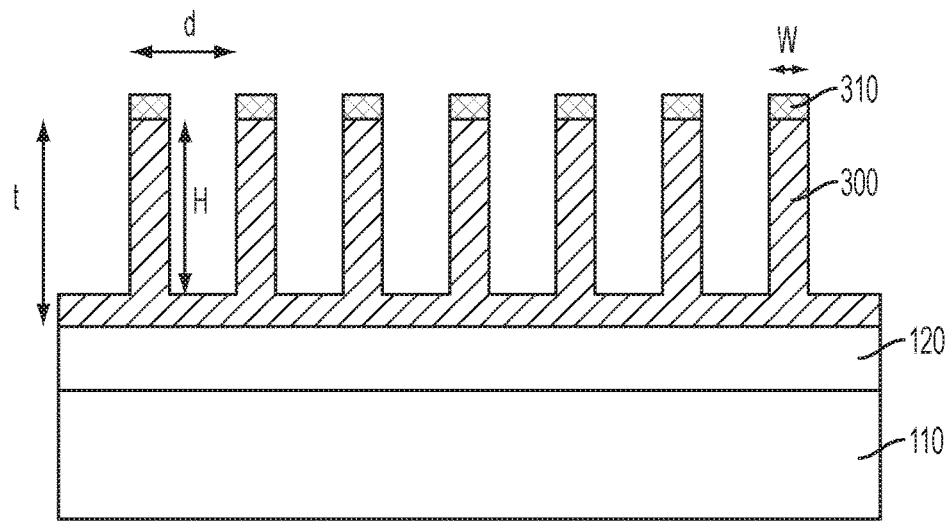
FIG. 4 is a schematic diagram showing a plurality of fins provided with a hard mask capping layer extending from a semiconductor layer of a semiconductor substrate.

As shown in FIG. 4, a plurality of fins 300 are formed on the substrate 100. In various embodiments, fins 300 comprise a semiconductor material such as silicon, and may be formed by patterning and then etching the semiconductor material layer 130.

The patterning process may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a hard mask layer 310, which is disposed over a top surface of the semiconductor material layer 130. The pattern provided by the patterned photoresist material is thereafter transferred into the underlying material layer or material layers (e.g., hard mask 310 and semiconductor material layer 130) utilizing at least one pattern transfer etching process.

In various embodiments, hard mask 310 comprises dielectric material such as silicon oxide, silicon nitride, silicon oxynitride or combinations thereof. In particular embodiments, the hard mask layer 310 includes a layer of silicon oxide and an overlying layer of silicon nitride. For example, the hard mask may include a layer of silicon oxide disposed directly over the top surfaces of the fins, and a layer of silicon nitride disposed directly over the layer of silicon oxide.

The pattern transfer etching process is typically an anisotropic etch. In embodiments, a dry etching process such as, for example, reactive ion etching can be used. In other embodiments, a combination of dry etching and wet etching can be used. As seen in the illustrated embodiment of FIG. 4, the pattern transfer etch may be stopped prior to reaching isolation layer 120 such that the fins extend upward from an un-etched portion of the semiconductor material layer 130 and thus have a fin height (H) that is less than the thickness (t) of the semiconductor material layer 130.

In other embodiments, the patterning process may include a sidewall image transfer (SIT) process or a double patterning (DP) process. The SIT process includes forming a mandrel material layer (not shown) atop the material or material layers (i.e., crystalline silicon) that is to be patterned. The mandrel material layer can include any material (semiconductor, dielectric or conductive) that can be selectively removed from the structure during a subsequently performed etching process. For instance, the mandrel material layer may be composed of amorphous silicon or polysilicon. The mandrel material layer may be composed of a dielectric such as, for example, $Si_3N_4$, a polyimide, or $SiO_2$. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that can be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the pattern provided by the dielectric spacers is transferred into the underlying material or material layers. The pattern transfer may be achieved by at least one etching process. Examples of etching processes that can be used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface. Each of a plurality of fins 300 can comprise a single crystal semiconductor material that extends along a lengthwise direction. As used herein, a "lengthwise direction" is a horizontal direction along with an object extends the most. As annotated in FIG. 4, a "widthwise direction" (W) is a horizontal direction that is perpendicular to the lengthwise direction.

In embodiments, fins 300 are formed from a crystalline semiconductor material. The semiconductor material forming fins 300 may be doped, undoped, or contain doped and undoped regions therein. Each doped region within the semiconductor fins 300 may have the same or different doping concentrations and/or conductivities. Doped regions that are present can be formed, for example, by ion implantation, gas phase doping, or by dopants that are present in the material used to form the fins. For instance, semiconductor layer 130 may comprise a dopant prior to forming the fins 300. By way of example, semiconductor layer 130 and hence fins 300 may be initially and uniformly doped and have a dopant concentration in the range of $1\times10^{15}$ atoms/$cm^3$ to $1\times10^{18}$ atoms/$cm^3$.

In various embodiments, the as-formed fins 300 are free standing, i.e., supported only by the substrate 100. Each fin has a height (H) that may range from 10 nm to 100 nm and a width (W) that may range from 4 nm to 30 nm. Other heights and widths that are less than or greater than the ranges mentioned can also be used. The fins 300 may have an aspect ratio (H/W) ranging from 1 to 5, e.g., 1, 1.5, 2, 3, 4 or 5, including ranges between any of the foregoing values.

In structures comprising plural fins, i.e., a fin array, each fin may be spaced apart from its nearest neighbor by a periodicity or pitch (d) of 15 nm to 100 nm, e.g., 15, 20, 25, 30, 40, 50, 75 or 100 nm, including ranges between any of the foregoing values. In particular embodiments, fins within a first region of the device may be spaced apart from nearest neighbors at a pitch of 40 to 100 nm, e.g., 40, 50, 60, 75 or 100 nm, while fins within a second region of a device may be spaced apart from nearest neighbors at a pitch of 15 to 30 nm, e.g., 15, 20, 25 or 30 nm, including ranges between any of the foregoing values. Such plural fins are typically oriented parallel to each other and perpendicular to the library logic flow of a circuit, but could as well run parallel to the library logic flow of a circuit.

In various embodiments, each of a plurality of semiconductor fins 300 extends along a lengthwise direction with a substantially rectangular vertical cross-sectional shape. As used herein, a "substantially rectangular shape" is a shape that differs from a rectangular shape only due to photolithographic and process rounding that does not exceed 3 nm. The substantially rectangular vertical cross-sectional shape is a shape within a plane including a vertical direction and a widthwise direction.

Plural fins may have identical or substantially identical dimensions, i.e., height and/or width. As used herein, substantially identical dimensions vary by less than 10%, e.g., less than 5%, 2% or 1%.

The supporting substrate 110 and the insulator layer 120 collectively function as a substrate on which the plurality of semiconductor fins 300 are disposed. The substantially rectangular vertical cross-sectional shape adjoins a horizontal interface parallel with a top surface of the insulator layer 120. As shown in FIG. 4, each fin 300 when formed has a bottom surface that is contiguous with a portion of the semiconductor material layer 130.

Figure 5:
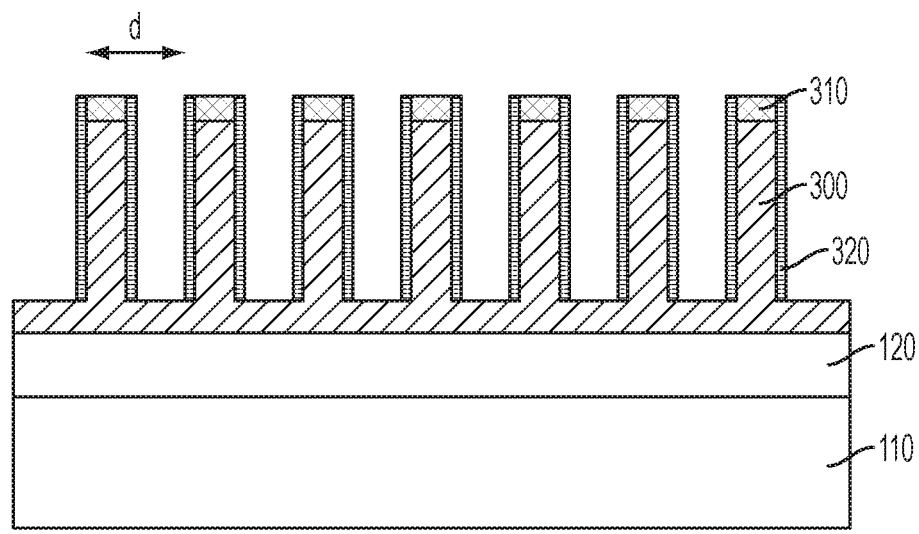
FIG. 5 shows the formation of a sacrificial spacer layer on the fin sidewalls.

Referring next to FIG. 5, a protective sidewall spacer 320 is formed over the fin sidewalls, including sidewalls of residual hard mask 310. The protective sidewall spacer may comprise a dielectric material such as silicon oxide, silicon nitride, silicon oxynitride or combinations thereof. In particular embodiments the protective sidewall spacer 320 includes a layer of silicon oxide and a layer of silicon nitride. For example, the protective sidewall spacer 320 may include a layer of silicon oxide formed directly over the fin sidewalls, and a layer of silicon nitride formed directly over the layer of silicon oxide. Buffering of silicon nitride with silicon oxide facilitates later removal of the protective sidewall spacer 320.

In various embodiments, formation of the protective sidewall spacer 320 includes a conformal deposition process such as chemical vapor deposition (CVD), followed by an anisotropic etch to remove the spacer material(s) from horizontal surfaces. A total thickness of the sidewall spacer 320 may range from 5 to 10 nm, for example.

Figure 6:
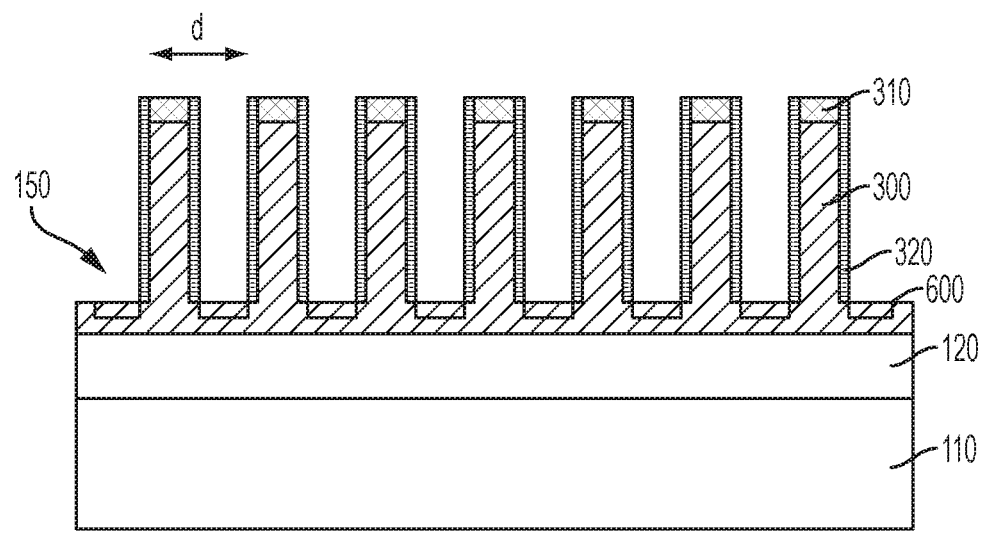
FIG. 6 shows the formation of self-aligned, epitaxial drain regions within the semiconductor substrate adjacent to the fins.

Referring to FIG. 6, using a selective etch, cavities 150 are formed in the top surface of semiconductor layer 130 between adjacent fins 300 and around the fin endwalls. The cavity-forming etch may be an isotropic or an anisotropic etch. In various embodiments, formation of cavities 150 does not completely undercut fins 300.

Then, using a selective epitaxy process, the cavities are backfilled with a semiconductor material to form bottom drain regions 600. It should be recognized that whenever a region is identified as a source region or a drain region, it is only for convenience as the source and drain regions can be interchanged as understood in the art.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Drain regions 600 may comprise silicon, silicon germanium, or another suitable semiconductor material.

An example silicon epitaxial process for forming silicon source (or drain) region(s) uses a gas mixture including $H_2$ and dichlorosilane ($SiH_2Cl_2$) at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

The selective epitaxy process deposits an epitaxial layer directly onto the exposed semiconductor layer 130 within cavities 150. In various embodiments, a silicon epitaxial layer is formed in cavities without deposition of silicon on the exposed surfaces of the protective sidewall spacer 320. In such a process, for example, a reduced partial pressure of reactants can suppress nucleation of silicon on the sidewall spacer 320. According to various embodiments, selective epitaxial layers may be formed using molecular beam epitaxy or chemical vapor deposition processes that are adapted for selective epitaxy. The thickness of the drain regions 600 may range from 15 to 40 nm, e.g., 15, 20, 25, 30, 35 or 40 nm, including ranges between any of the foregoing values.

In various embodiments, drain regions 600 are doped. Doping of the drain regions 600 may occur during epitaxial growth, i.e., the drain regions are doped in situ. Moreover, as discussed in further detail below with reference to FIG. 8 and the formation of the source regions 500, it will be appreciated that doping of the source regions 500 may also occur during the epitaxial process used to form the source regions 500, i.e., the source regions are doped in situ.

As known to those skilled in the art, doping changes the electron and hole carrier concentrations of an intrinsic semiconductor at thermal equilibrium. A doped layer or region may be p-type or n-type. A p-type dopant is used to manufacture a PFET and an n-type dopant is used to manufacture an NFET.

As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. The dopant(s) may be introduced by plasma doping, or may be introduced, for example, in situ, i.e., during the process sequence used to form the layer.

By way of example, a dopant region, e.g., source or drain region, may be in-situ doped with arsenic or phosphorus to form an n-type region. The dopant concentration within the source and drain regions may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$. In another example, a dopant region is in-situ doped with boron to form a p-type region. The dopant concentration within the source and drain regions may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$.

An optional drive-in anneal can be used to diffuse dopant species and generate a desired dopant profile. In certain embodiments, dopant atoms within the source and drain regions 500, 600 may be diffused into the adjacent fins 300 using a post-epitaxy anneal (e.g., at a temperature of 700 to 1100° C.) to create a dopant profile within the fins proximate to the source and drain regions 500, 600. The dopant profile within the fins 300 may be constant or variable. For instance, the dopant concentration within the fins may vary laterally, with a minimum dopant concentration (e.g., $1\times10^{19}$ to $1\times10^{22}$ atoms/cm$^3$) along a central axis of the fins and a maximum dopant concentration (e.g., $1\times10^{19}$ to $1\times10^{22}$ atoms/cm$^3$) at opposing surfaces thereof.

Figure 7:
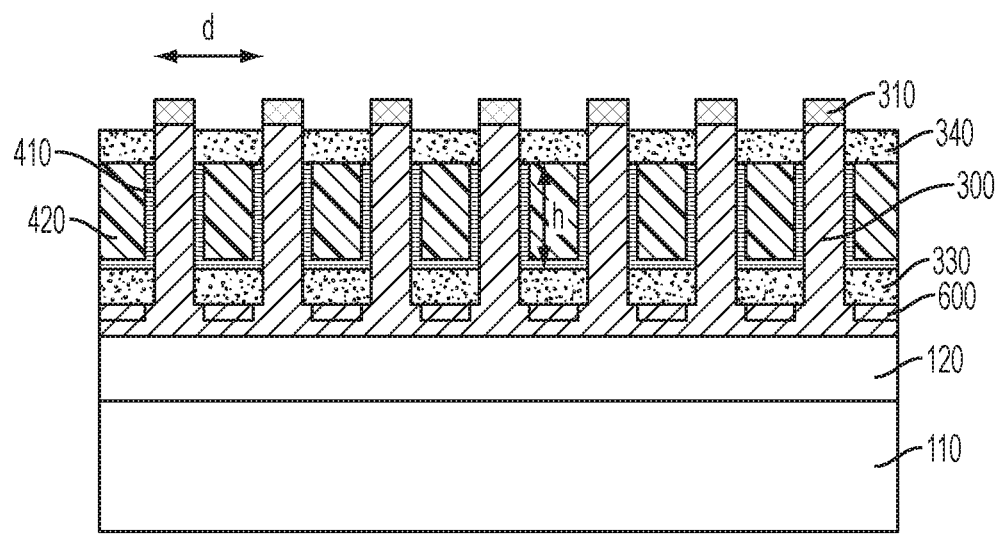
FIG. 7 shows the formation of a shared gate stack over sidewalls of the fins and between lower and upper dielectric spacer layers.

Referring to FIG. 7, after forming the drain regions 600, a selective etch is used to remove the protective sidewall spacer 320 and expose the sidewalls of the fins. Thereafter, a dielectric spacer layer 330 is formed over the top surface of the drain region 600 and over exposed bottom portions of the semiconductor fins 300. In various embodiments, dielectric spacer layer 330 is in direct physical contact with the drain region 600 and with lower portions of the sidewalls of the fins 300.

Dielectric spacer layer 330 may comprise silicon dioxide, silicon nitride, silicon oxynitride, a low-k material (i.e., a dielectric material having a dielectric constant of less than silicon dioxide), or any suitable combination of these materials. The dielectric spacer layer 330 may be deposited by a suitable process such as atomic layer deposition (ALD), chemical vapor deposition (CVD), physical vapor deposition (PVD), thermal oxidation, UV-ozone oxidation, or combinations thereof. The dielectric spacer layer 330 is adapted to isolate the drain region 600 from the gate of the transistor. According to various embodiments, the height of the dielectric spacer layer 330 may range from 5 to 15 nm, e.g., 5, 10 or 15 nm, including ranges between any of the foregoing values.

A gate stack is then formed above the dielectric spacer layer 330 and over the sidewalls of the fins 300. The gate stack 400 comprises a gate dielectric 410 and a gate electrode 420, which are deposited in succession. In various embodiments, the height (h) of the gate stack may range from 10 to 40 nm, e.g., 10, 15, 20, 25, 30, 35 or 40 nm, including ranges between any of the foregoing values.

The gate dielectric 410 may be a conformal layer that is formed over exposed surfaces of the fins and over a top surface of dielectric spacer 330. Gate dielectric 410 may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric 410 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing. In various embodiments, the gate dielectric 410 includes a thin layer (e.g., 0.5 nm) of silicon oxide and an overlying layer of high-k dielectric material.

A gate electrode 420 is formed over the gate dielectric 410. The gate electrode 420 may include a conductive material such as doped polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode 420 may comprise one or more layers of such materials such as, for example, a metal stack including a work function metal layer and/or a liner.

The gate electrode 420 may be a conformal layer that is formed over exposed surfaces of the structure. The gate electrode 420 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

According to various embodiments, due to the proximity of the fins to each other (e.g., d≤30 nm), the gate electrodes 420 formed over the gate dielectric layer of adjacent fin sidewalls can pinch-off and merge in the region between adjacent fins. According to various embodiments, the consolidated (merged) gate electrode thickness may range from 5 to 25 nm, e.g., 5, 10, 15, 20 or 25 nm, including ranges between any of the foregoing values. The gate electrode 420 and gate dielectric 410 can be etched back and recessed using an anisotropic etch to expose the hard mask 310 and upper sidewall surfaces of fins 300. During etch back of the gate stack materials, hard mask 310 can protect the top surface of the fins 300.

Following the recess etch of the gate stack, a further dielectric spacer layer 340 is deposited over exposed surfaces of the structure. The dielectric spacer layer 340 may be self-planarizing, or the top surface of the dielectric spacer layer 340 can be planarized, for example, by chemical mechanical polishing (CMP). Chemical mechanical polishing (CMP) is a material removal process that uses both chemical reactions and mechanical forces to remove material and planarize a surface. Hard mask 310 may function as a CMP etch stop during planarization of the dielectric spacer layer 340, during which step the hard mask 310 may be substantially removed.

Figure 8:
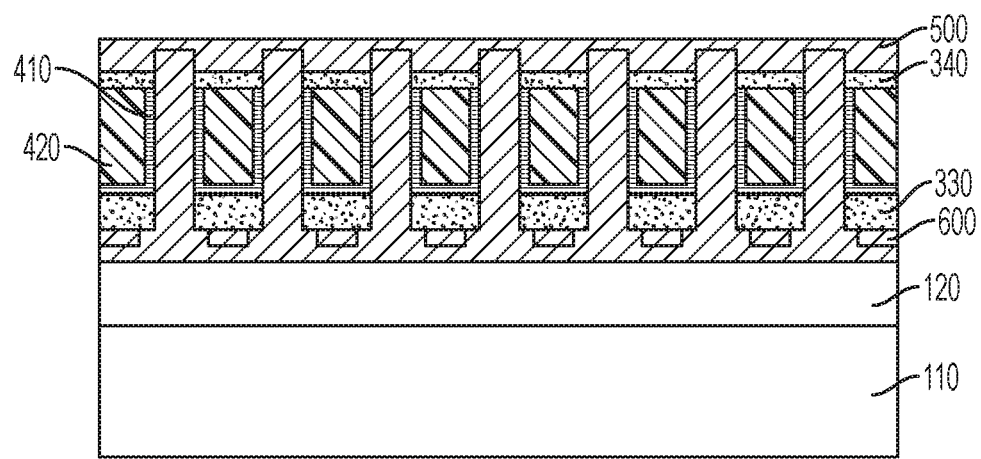
FIG. 8 shows removal of the hard mask capping layer and formation of a merged source region contacting upper surfaces of a plurality of fins.

In some embodiments, as shown in FIGS. 7 and 8, the dielectric spacer layer 340 is planarized (i.e., to the height of the fins 300) and then etched back to reveal upper portions of the sidewalls of the fins 300. After forming the gate stack 400, i.e., during etch back of the dielectric spacer layer 340, a clean up etch can be used to completely remove the hard mask 310.

According to various embodiments, the height of the dielectric spacer layer 340 may range from 5 to 15 nm, e.g., 5, 10 or 15 nm, including ranges between any of the foregoing values. The dielectric spacer layer 340 is adapted to isolate the source region 500 from the gate of the transistor.

As shown in FIG. 8, a merged source region 500 is formed above sacrificial gate 400, i.e., directly over dielectric spacer layer 340. Source region 500 may be formed using epitaxial growth from exposed surfaces of fins 300. Exposed surfaces of the fins may include the top surface as well as upper portions of the sidewalls of the fins proximate to the top surface. Inter-fin merger of the source region 500 may be accomplished during epitaxial growth or during post-epitaxy deposition of a conductive filler to bridge (or strap) the source region from fin-to-fin.

Epitaxial source region 500 may be doped as described above with respect to epitaxial drain region 600. In various embodiments, the dopant type and dopant concentration with source region 500 are equal to the dopant type and dopant concentration within the drain region 600.

Source and drain contacts (not shown) may be formed by etching contact vias and depositing a suitable conductor into the vias using a deposition process such as ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The thickness of the source region 500 may range from 15 to 40 nm, e.g., 15, 20, 25, 30, 35 or 40 nm, including ranges between any of the foregoing values.

Source and drain contacts may comprise a conductive metal such as Al, W, Ti, Ta, W, Pt, Au, Ru, Ir, Rh and Re, alloys of conductive metals, e.g., silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof.

Illustrated in FIGS. 3-8 are embodiments of a process to form a vertical-transport field effect transistor as well as the resulting structure. The vertical-transport transistor architecture includes one or more vertical fins 300 connecting a source region 500 with a drain region 600. The source region 500 and the drain region 600 are shared across a plurality of the fins 300, which are disposed with respect to one other at a pitch (d) of 30 nm or less. According to various embodiments, the tight pitch (d≤30 nm) is enabled by the sharing of a merged gate across the plurality of fins.

According to various embodiments, a device architecture includes an array of fins having such merged source, drain and gate regions. An example device architecture includes both merged and unmerged source, drain and gate regions. For instance, as shown schematically in FIG. 9, a device may include a first region (I) comprising a plurality of fins 300 having isolated source, drain and gate regions, and a second region (II) comprising a plurality of fins 300 having merged source, drain and gate regions. According to various embodiments, the number of adjacent fins having a merged source region, drain region and gate region may be five or more, e.g., 5 to 25 fins, such as 5, 7, 10, 15, 20 or 25 fins, including ranges between any of the foregoing values.

Figure 9:
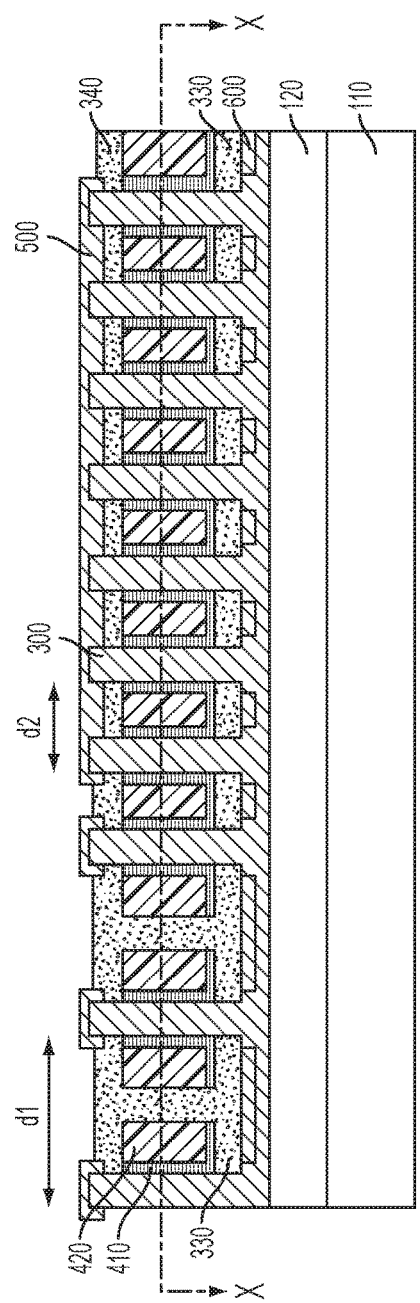
FIG. 9 is a schematic cross-sectional view of a hybrid transistor architecture including a first device region including fins spaced at a first pitch with isolated source, gate and drain regions, and a second device region including fins spaced at a second pitch less than the first pitch with merged source, gate and drain regions.
Figure 10:
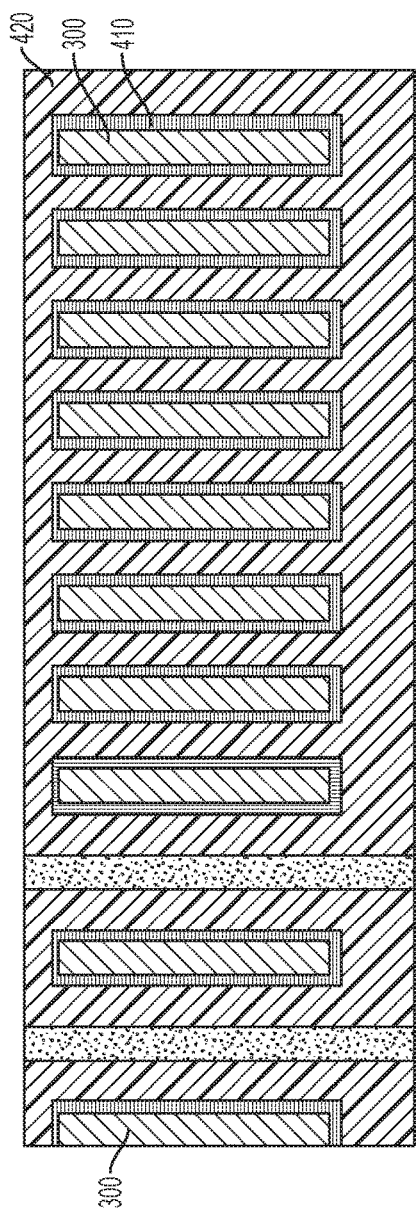
FIG. 10 is a plan view of the hybrid transistor architecture of FIG. 9 along line X-X.

FIG. 10 is plan view schematic of the FIG. 9 architecture along a cross section X-X showing isolated gate stacks within a first region of the device and merger of the gate stacks within a second region of the device. The fin pitch is greater within the first region of the device than within the second region of the device.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric layer that comprises silicon nitride include embodiments where a dielectric layer consists essentially of silicon nitride and embodiments where a dielectric layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A vertical-transport FinFET device comprising:
   a semiconductor substrate;
   a plurality of first fins arranged at a first pitch (d1) on the semiconductor substrate;
   a plurality of second fins arranged at a second pitch (d2) on the semiconductor substrate, wherein the ratio of the first pitch to the second pitch (d1/d2) is greater than 1;
   a source region in shared electrical contact with the plurality of second fins at respective upper ends thereof; and
   a drain region in shared electrical contact with the plurality of second fins at respective lower ends thereof, the plurality of second fins each further comprising a channel region between the source and drain regions.

2. The vertical-transport FinFET device of claim 1, wherein the ratio of the first pitch to the second pitch (d1/d2) ranges from 1.5 to 3.

3. The vertical-transport FinFET device of claim 1, wherein the ratio of the first pitch to the second pitch (d1/d2) is 2.

4. The vertical-transport FinFET device of claim 1, wherein the first pitch (d1) ranges from 40 to 100 nm and the second pitch (d2) ranges from 15 to 30 nm.

5. The vertical-transport FinFET device of claim 1, further comprising:
   a gate dielectric layer on sidewalls of the channel regions; and
   a shared gate conductor layer disposed over and electrically isolated from the channel regions by the gate dielectric layer.

6. The vertical-transport FinFET device of claim 1, wherein the plurality of second fins comprises at least 5 fins.

7. The vertical-transport FinFET device of claim 1, further comprising a plurality of source regions each respectively in electrical contact with the plurality of first fins at respective upper ends thereof.

8. The vertical-transport FinFET device of claim 1, further comprising:
   a gate dielectric layer on sidewalls of respective ones of the plurality of first fins adjacent to respective source regions; and
   a gate conductor layer disposed over and electrically isolated from the fins by the gate dielectric layer.

9. A vertical-transport FinFET device comprising:
   a semiconductor substrate;
   a plurality of at least 5 fins on the semiconductor substrate arranged at a pitch ranging from 15 to 30 nm;
   a source region in shared electrical contact with the plurality of fins at first respective ends thereof; and
   a drain region in shared electrical contact with the plurality of fins at second respective ends thereof.

10. The vertical-transport FinFET device of claim 9, wherein the plurality of fins each further comprises:

a channel region between the source and drain regions;
a gate dielectric layer on sidewalls of the channel regions; and
a shared gate conductor layer disposed over and electrically isolated from the channel regions by the gate dielectric layer.

11. A method of forming a vertical-transport semiconductor device, comprising:
   forming a plurality of first and second fins on a semiconductor substrate,
   forming a merged source region in electrical contact with a plurality of the second fins at respective upper ends thereof; and
   forming a merged drain region in electrical contact with a plurality of the second fins at respective lower ends thereof, the plurality of the second fins each further comprising a channel region between the merged source and drain regions,
   wherein the plurality of first fins are arranged at a first pitch (d1) and the plurality of second fins are arranged at a second pitch (d2) where d1>d2.

12. The method of claim 11, wherein the ratio of the first pitch to the second pitch (d1/d2) ranges from 1.5 to 3.

13. The method of claim 11, wherein the first pitch (d1) is 40 to 100 nm and the second pitch (d2) ranges from 15 to 30 nm.

14. The method of claim 11, comprising:
   forming a gate dielectric layer on sidewalls of the channel regions; and
   forming a merged gate conductor layer over and electrically isolated from the channel regions by the gate dielectric layer.

15. The method of claim 11, comprising:
   forming unmerged source regions in electrical contact with the plurality of first fins at respective upper ends thereof; and
   forming unmerged drain regions in electrical contact with the plurality of first fins at respective lower ends thereof.

* * * * *